United States Patent [19]

Shaw

[11] Patent Number: 4,473,270
[45] Date of Patent: Sep. 25, 1984

[54] SPLICE-FREE FIBER OPTIC RECIRCULATING MEMORY

[75] Inventor: Herbert J. Shaw, Stanford, Calif.

[73] Assignee: Leland Stanford Junior University, Stanford, Calif.

[21] Appl. No.: 314,473

[22] Filed: Oct. 23, 1981

[51] Int. Cl.³ .............................................. G02B 5/172
[52] U.S. Cl. .................................. 350/96.15; 365/64; 365/76; 455/612
[58] Field of Search ............................. 350/96.15, 96.16; 455/610, 612; 365/64, 73, 76

[56] References Cited

U.S. PATENT DOCUMENTS

| | | | |
|---|---|---|---|
| 4,136,929 | 1/1979 | Suzaki | 350/96.15 |
| 4,166,212 | 8/1979 | Judeinstein | 350/96.16 X |
| 4,342,499 | 8/1982 | Hicks, Jr. | 350/96.15 |

Primary Examiner—John D. Lee
Attorney, Agent, or Firm—Knobbe, Martens, Olson & Bear

[57] ABSTRACT

A fiber optic recirculating memory is disclosed which utilizes a single splice-free single mode optical fiber coupled to itself to form a loop which acts as a delay line. A single signal supplied as an input to the device will result in a series of output signals identical to the input signal, although at smaller, decreasing amplitudes. In addition to being useful as a recirculating memory device for use in a system where data is generated at a rate faster than it can be accepted by a data processor, the invention may be used as a tap filter to pass a selected fundamental frequency and its harmonics, and to attenuate all other frequencies.

28 Claims, 7 Drawing Figures

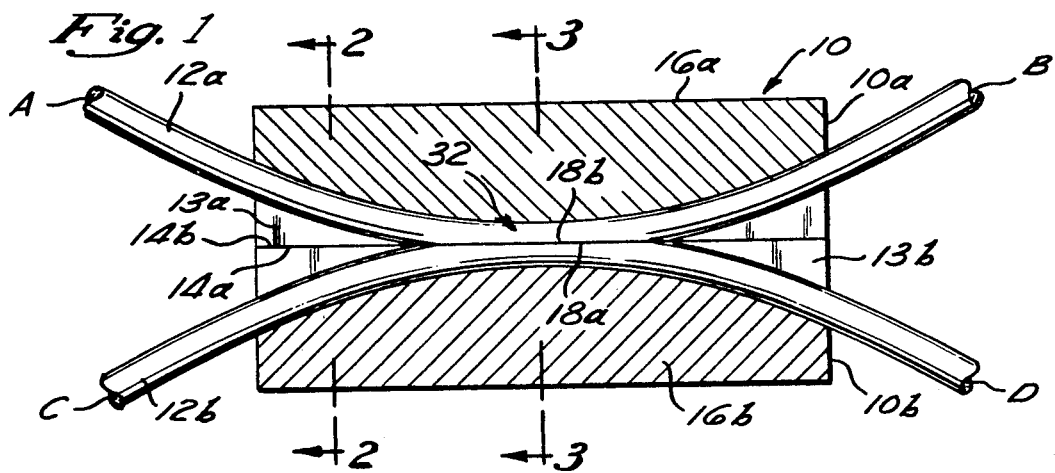
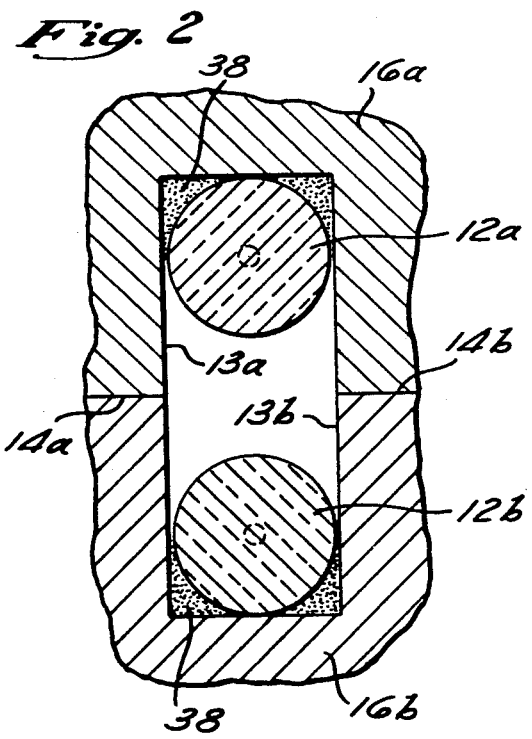
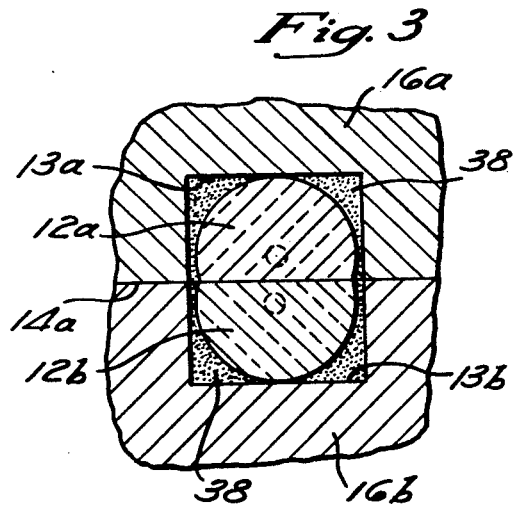
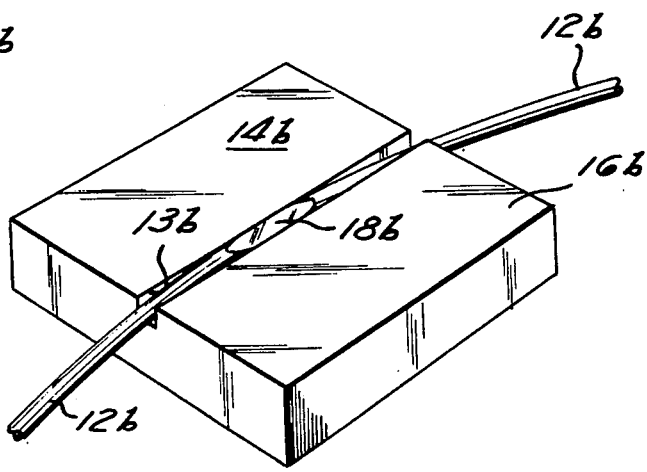

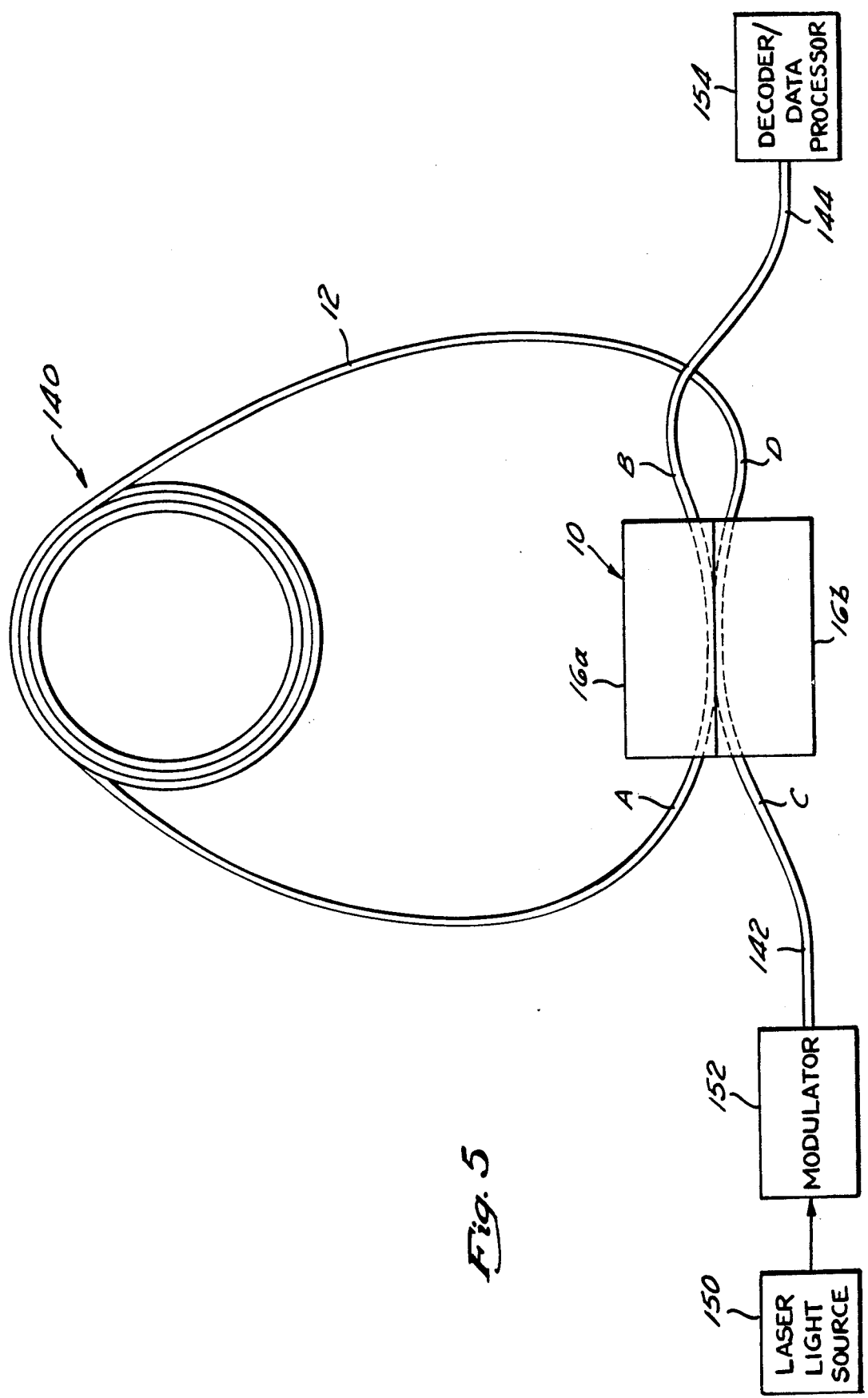

SPLICE-FREE FIBER OPTIC RECIRCULATING MEMORY

BACKGROUND OF THE INVENTION

In a recirculating memory, data is injected into a closed loop at a high rate, and recirculates around the loop in a continuous unidirectional motion. The entire group of data stored in the loop may be repeatedly read from the loop at a period equal to the time taken for the data to complete one cycle around the loop. In this way, a group of data may be stored in the recirculating memory, and the data may be read from the memory at a slower rate since the data will continue to circulate in the loop for some extended period of time, thus allowing different portions of the data to be sampled after each circulation.

Such systems are quite useful in applications where data is generated at a rate faster than it can be accepted by a data processor. By installing a recirculating memory between the data source and the data processor, the data can be supplied to the data processor at the rate necessary for the data processor to analyze the data without losing any of it. Another use of recirculating memory devices is for the temporary storage and retrieval of broadband microwave signals in electronic counter-measures (ECM) used to jam radar signals or to project false radar images.

Many of these systems use coaxial cables or acoustic wave guides rather than using a loop for the storage of signals modulated onto the microwave carriers. Such devices are basically delay lines in which a time delay is produced because of the time a signal takes to travel though the delay lines from the input end to the output end. In addition to the direct output of a given input signal, a portion of that signal will be reflected and will propagate from the output end back to the input end, where it is reflected to the output end again, resulting in a second output signal identical to the first output signal, although smaller in amplitude. The data pulse will continue to be reflected and output from the delay lines for some period of time, resulting in a number of identical pulses, equidistantly spaced, with decreasing amplitude.

The coaxial cable delay line is the most common type of delay line, and microwave signals may be stored in coaxial cables for some period of time. Coaxial cable may be used with directional couplers, which couple a secondary system to a wave traveling in a particular direction in the primary transmission system. When used as a recirculating memory, however, coaxial delay lines have several disadvantages. The first disadvantage is the limited bandwidth of coaxial cable, making coaxial cable useless at high frequencies and with short pulses.

At frequencies above 100 MHZ, coaxial cable is subject to severe losses, and high frequencies will thus not be transmitted accurately. In addition, if the pulse being transmitted is of extremely short duration, e.g., one nanosecond, it will be degraded and spread out rather than remaining sharp. This limits the number of pulses which can be transmitted close together, and, consequently, the information-carrying capability of the coaxial cable.

A second disadvantage of coaxial cable is that it is susceptible to electromagnetic interference, particularly when the frequencies being transmitted are relatively high. Finally, in order to have a coaxial cable delay line with a sufficiently long delay time, a considerable length of coaxial cable is necessary. Such delay lines are quite bulky, and also fairly expensive.

A second technique utilized to create delay lines and recirculating memories is through the use of acoustic delay lines. There are two types of acoustic delay lines: bulk-wave devices, and surface-wave devices. Bulk-wave devices use the principle of compression and rarification of the bulk material, and have input and output transducers at the ends of the bulk material. Bulk-wave devices unfortunately require large bias voltages and thus present a heat dissipation problem, so that only pulsed operation of bulk-wave devices is feasible.

Surface-wave devices operate with acoustic surface waves, and utilize charge carriers in a thin film of silicon placed adjacent to an insulating piezoelectric crystal. Surface acoustic wave memories operating at UHF frequencies have been developed. The main disadvantage of such acoustic wave memories is that their upper operational frequency limit is approximately 1 GHZ, while it is desirable to have a recirculating memory operable at higher frequencies.

Attempts to develop a fiber optic recirculating memory have been unsuccessful, in part because of the lack of an optical directional coupler. One attempt to create such a system is disclosed in U.S. Pat. No. 4,136,929, to Suzaki, entitled "Apparatus for Generating Light Pulse Train." The object of this invention was to produce a pulse train with identical pulses as an output, with a single pulse as the input to the system. The most interesting embodiment of this invention is shown in FIG. 1A, which has a fiber running through a coupling device with the ends of this fiber being the input and output, and a loop fiber also running through the coupler device and being optically coupled with the input-output fiber.

This concept is rendered impractical by the fact that it is not possible to manufacture a single continuous fiber loop, which must be used as the recirculating delay line. The only way the invention of the Suzaki patent could be implemented is to splice a length of glass fiber to produce the loop. Whenever a splice is necessary, there are considerable losses in the light being transmitted through the fiber due to the splice. Therefore, any device embodying a spliced fiber is, and must be, an inefficient device.

A second problem with the Suzaki apparatus is that it does not utilize evanescent field coupling in the coupling device utilized. The coupling device utilized requires that the glass fibers be cut and polished until the cores of the fibers are exposed to create an optical couple between the fibers. This presents the possibility that the core of the fiber may be damaged in the process, further lowering the efficiency of the Suzaki device. In addition, since the evanescent fields are not coupled, the coupling loss, which is the difference between the amount of light going into the coupler and the amount of light coming out of the coupler, may be significant.

Finally, the Suzaki device utilizes multi-mode fibers rather than single mode fibers. Multi-mode fibers have a much larger core diameter than do single mode fibers. Since multi-mode fibers have a larger core, the angle of refraction is greater, and thus multi-mode fibers are quite susceptible to modal dispersion, which will limit the bandwidth to 500 MHZ to 1 GHZ. Even when using a graded index multi-mode fiber, where dispersion is minimized by grading of the index of refraction, maximum band width of signals to be transmitted is only slightly above 1 GHZ. The exact bandwidth, of course, will depend on the frequency of the light, since light of a given wavelength may have minimal dispersion due to properties of the optical fiber.

Single mode fiber does not have modal dispersion problems, since the diameter of the single mode fiber core is relatively small. While any optical fiber will have some material dispersion, the effects of material dispersion are several orders of magnitude less than those of modal dispersion.

Therefore, the Suzaki device possesses the disadvantages of having a limited bandwidth, and of having relatively high losses, which impede the transmission of a pulse train of any length. For these reasons, the Suzaki device is not useful as a recirculating memory device with a high frequency data input.

SUMMARY OF THE INVENTION

The invention is a recirculating memory utilizing a fiber optic waveguide comprised of a splice-free single mode optical fiber. The delay line is comprised of a coil of the optical fiber, with the two ends of the coil coupled by a directional fiber optic coupler. This fiber optic coupler, along with the method for manufacturing it, is described in detail in co-pending patent application Ser. No. 300,955, filed Sept. 10, 1981, entitled "Fiber Optic Directional Coupler," and is assigned to the assignee of the present invention. That co-pending patent application is hereby incorporated herein by reference.

The coupler is fabricated so that a portion of the light which is leaving the loop will be coupled back into the loop. That portion of the light which is not coupled into the loop is supplied into the output end of the fiber. Therefore, when a high frequency light signal is supplied to the device, it will be stored in the recirculating loop to provide periodic outputs. The outputs of the device will be serial repetitions of the input signal, with decreasing amplitude.

This device possesses several advantages over the other devices described above. The most important advantage, and one which is held over coaxial cable devices, acoustic devices, and the device of the Suzaki patent, is that the invention will function at very high frequencies. Since the optical frequencies may be of the order of $10^{14}$ HZ, frequencies several orders of magnitude higher than one GHZ may be modulated onto the optical carrier frequencies used. In this way, numerous rapid pulses occurring in a short period of time may be stored in the recirculating memory and supplied to the data processor at a slower rate.

The present invention has several other advantages over coaxial cable devices. There are comparatively minimal losses with the present invention, even at high system frequencies, and pulses of very short duration will not be significantly degraded since the system is using single mode fiber optics. Another advantage is that fiber optics are not susceptible to electro-magnetic interference. Finally, a single mode fiber optic line providing the same delay time of a bulky coaxial cable is fairly compact, since single mode optical fibers have a much smaller diameter than does coaxial cable.

The present invention has the advantage of being operational at a much higher frequency than devices utilizing acoustic wave delay techniques. In addition, fiber optic devices operate at fairly low power levels, thus eliminating the heat dissipation problems of bulk-wave devices.

The advantages of the present invention over the Suzaki device are that the present device is splice-free, utilizes singe-mode fibers, and uses evanescent field coupling. Since the device embodying the present invention is splice-free, and therefore has lower losses, the series of pulses will be of a higher amplitude and will diminish at a slower rate than will pulses obtained by the Suzaki device. This allows more circulations of the light in the loop, and thus a longer memory. Since single mode fiber is used, the present invention allows pulses of shorter duration and high repetition rates to be transmitted. Finally, since evanescent field coupling is utilized, the present invention provides a more efficient, stable, and controllable coupling of the optical fibers, and thus a greater degree of control over the characteristics of the signal output from the device.

These and other advantages of the present invention are best understood through reference to the drawings, in which:

FIGS. 1 through 4 are identical to the FIGS. 1 through 4 in the copending patent application described above which is incorporated herein by reference. These figures include:

FIG. 1 is a cross-sectional view of the fiber optic coupler used in the present invention;

Figure 7:
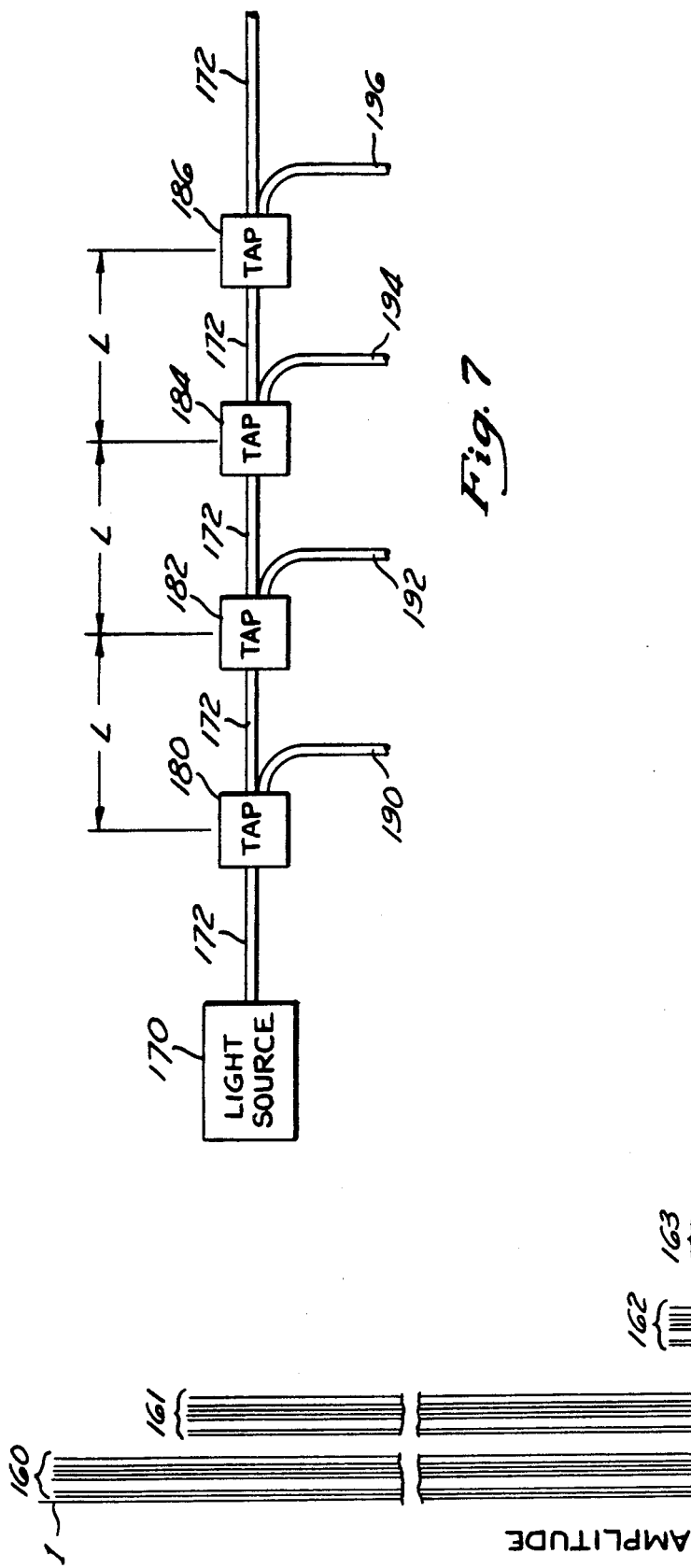
Figure 6:
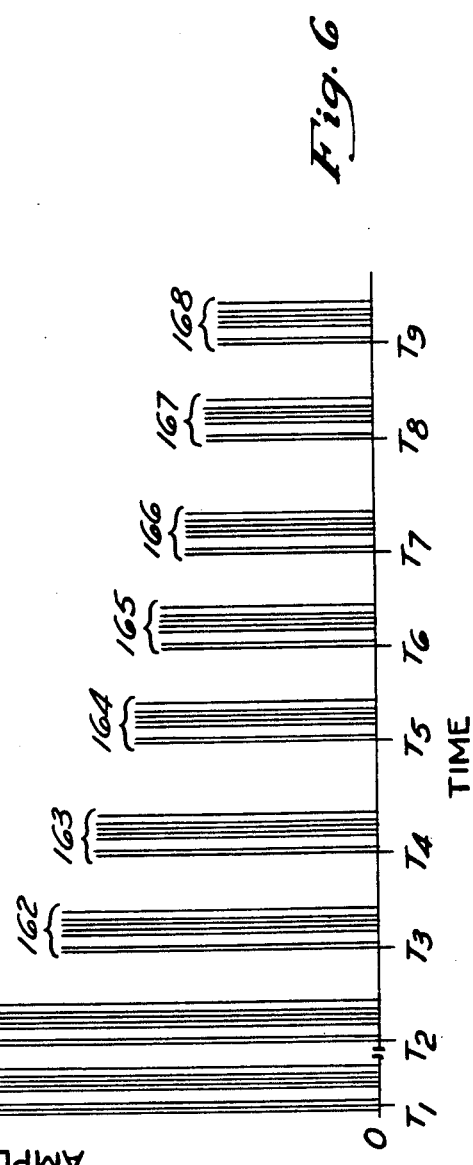

FIGS. 2 and 3 are cross-sectional views of the coupler of FIG. 1, taken along the lines 2—2 and 3—3, respectively;

FIG. 4 is a perspective view of one element of the coupler of FIG. 1, separated from the other element thereof, to show the configuration of the confronting face of said element;

FIG. 5 shows the recirculating memory of the present invention incorporating the optical coupler of FIG. 1;

FIG. 6 is an amplitude v. time plot of the device of FIG. 5, including a single input signal, and the initial signals of the resulting series of output signals from that device; and FIG. 7 shows a simple optical tap delay line which may be used as a transversal filter.

DETAILED DESCRIPTION OF THE PREFERRED EMBODIMENT

Referring initially to FIGS. 1 through 4, a fiber optic directional optic coupler which may be used to form a recirculating loop memory is shown. This fiber optic coupler, along with a method for its manufacture, is described in detail in the co-pending patent application incorporated by reference above. A brief description of FIGS. 1 through 4 will be provided to permit an understanding of the essential characteristics of the fiber optic coupler.

The coupler 10 includes two strands, 12A and 12B, of a single mode fiber optic material mounted in longitudinal arcuate grooves 13A and 13B, respectively, formed in optically flat confronting surfaces 14A and 14B, respectively, of rectangular bases or substrates 16A and 16B, respectively.

Each of the strands 12A and 12B comprises a commercially available fiber of quartz glass which is doped to have a central core and an outer cladding. The applicant has found that the present invention works effectively with single mode fibers, which typically have a core diameter in the order of 10 microns or less, and a cladding diameter on the order of 125 microns.

The arcuate grooves 13A and 13B have a radius of curvature which is very large compared to the diameters of the strands 12. Thus the fiber optic strands 12A and 12B, when mounted in the grooves 13A and 13B, respectively, gradually converge toward the center and diverge toward the edges of the substrates 16A and 16B. At the centers of the substrates 16, the depth of the grooves 13 which mount strands 12 is less than the diameter of the strands 12, while at the edges of the blocks 16, the depth of the grooves 13 is preferably at least as great as the diameter of the strands 12. Fiber optic material is removed from each of the strands 12A and 12B to form respective oval shaped, planar surfaces 18A, 18B which are co-planar with the confronting surfaces 17A, 17B, respectively, of the substrates 16A and 16B, respectively. In the embodiment shown, the coupler halves 10A and 10B are identical and are assembled by placing the confronting surfaces 14A and 14B of the substrates 16A and 16B together so that the surfaces 18A and 18B of the strands 12A and 12B are in facing relationship. An index matching substance (not shown), such as index matching oil, is provided between the confronting surfaces 14. This substance has a refractive index approximately equal to the refractive index of the cladding and also functions to prevent the optically flat surfaces 14 from becoming permanently locked together.

An interaction region 32 is formed at the junction of the strands 12. In this region 32 light is transferred between the strands 12a, 12b by evanescent field coupling. Furthermore, as explained in the above referenced copending patent application, when the spacing between the cores of the strands 12 is within a critical zone, each strand receives a significant portion of the evanescent field energy from the other strand and optimum coupling is achieved without significant energy loss. For a single mode fiber having a step index gradient, the critical zone can be quite narrow. In a single mode fiber of the type shown in FIGS. 1 through 4, for example, the required center-to-center spacing between the strands 12 at the center of the coupler is typically less than a few (for example, 2-3) core diameters.

Preferably the strands 12A and 12B are symmetrical through the interaction region 32 in the plane of the facing surfaces 18 so that the facing surfaces 18a and 18b are coextensive if superimposed.

The coupler 10 includes four ports labeled A, B, C and D in FIG. 1. If it is assumed that input light of a suitable wavelength (for example, 1.15 microns) is applied to port A, this light passes through the coupler and is output at port B and/or port D, depending on the amount of power that is coupled between the strands 12. In this regard, the term "normalized coupled power" is defined as the power ratio of the coupled power to the total output power. In the above example, the normalized coupled power would be equal to the ratio of the power at port D to the sum of the power output at ports B and D. This ratio is also referred to as the "coupling efficiency" and when so used is typically expressed as a percent. Thus, when the term "normalized coupled power" is used herein, it should be understood that the corresponding "coupling efficiency" is equal to the normalized coupled power times 100.

The coupler 10 operates on evanescent field coupling principles in which guided modes of the strands 12 interact through their evanescent fields to cause light to be transferred between the strands 12. As previously indicated, this transfer of light occurs at the interaction region 32. The amount of light transferred is dependent upon the proximity and orientation of the cores as well as the effective length of the interaction region 32. If the length of the interaction region 32 and the separation of the strands 12 within this region 32 are properly selected, light within the coupler will make only one transfer between the strands 12 as it travels through the interaction region 32. If the coupler is properly constructed, it is possible under such conditions to couple 100% of the light input at port A to port D. If the length of the interaction region 32 is further increased, or the separation between the strands 12 further reduced, a phenomenon referred to herein as "overcoupling" will occur in which the light will transfer back to the strand from which it originated. Several orders of "overcoupling" are possible. Thus, as the interaction length is still further increased or the separation is still further reduced, the light will make several transfers between the strands. This phenomenon is explained in detail in the incorporated copending application. Thus, the light may make multiple transfers back and forth between the two strands 12 as it travels through the region 32, the number of such transfers being dependent on the length of interaction region 32 and the spacing of the strands 12 within this region.

Referring now to FIGS. 5 and 6, the incorporation of the fiber optic coupler 10 into a splice-free fiber optic recirculating memory device is shown. It may be seen that a single continuous length of optical fiber 12 is used. The input end 142 of the fiber 12 enters the optical coupler 10 through port C, and exits the coupler 10 from port D. After the fiber 12 exits the coupler 10 from port D, a length of the fiber 12, for example 200 meters, is formed into a loop 140. The fiber 12 then leaves the loop 140 and enters the coupler 10 through port A, and exits from port B. The end of the fiber 12 which exits the coupler 10 through port B is the output end 144 of the fiber 12.

The operation of the recirculating memory device will now be described. The optimal coefficient of coupling 1 of the coupler 10 to provide a maximum number of recirculations is dependent on two variables in the system. The first of these is the ratio of the minimum detectable output power level $P_T$ to the level of power input to the system $P_O$. This ratio $P_T/P_O$ is typically about $1 \times 10^{-4}$, and the following calculations are made using this value for $P_T/P_O$.

The second variable is the percentage of power transmitted K by the loop 140, which is the amount of power input less losses in the glass fiber medium. Generally, the coefficient of coupling 1 will vary in direct proportion to the percentage of power transmitted K by the loop 140, as will be seen below. The formula for calculating the number of useable recirculating outputs n is as follows:

$$n = \frac{\ln \frac{P_T}{P_O} + \ln \frac{1}{(1-1)^2}}{\ln(K \cdot 1)} \quad (1)$$

Therefore, by using this formula, if the percentage of power transmitted by the loop 140 is 100% (K=1.), the optimal coupling coefficient is 0.975 to obtain the maximum number of useable output signals (which must by definition be at least $1 \times 10^{-4}$ of the input level). If 90% of the power is transmitted by the loop (K=0.9), the optimum coupling coefficient is 0.90.

If it is assumed, for example, that the loop 140 is a 200 m length of glass fiber, and that the loss of this fiber is about 1 db per kilometer, the optimum coupling coefficient is between 0.94 and 0.95. For convenience, the 0.95 figure will be used below in describing the operation of the recirculating memory device.

An input signal 160 of modulated light pulses shown in FIG. 6 is supplied to the input end 142 of the optical fiber 12 at time $T_1$, from a laser light source 150 and a modulator 152. This light will enter the optical coupler 10 through port C; since the coupling efficiency is 95%, 95% of the light will be coupled to the port B. Light exiting the coupler from port B leaves the optical fiber 12 through the fiber exit 144 at time $T_2$ which is an instant after $T_1$, and this is the first output signal 161 of a series of output signals supplied to a decoder/data processor 154.

The remaining 5% of the original input signal 160 which is not coupled exits the coupler 10 through port D, and continues through the optical fiber 12 into loop 140, which acts as a delay line. After some period of time, which is directly proportional to the length of the fiber 12 in the loop 140, the light will leave the loop 140. The light will then enter the coupler 10 through port A, and 95% of the light will be coupled to port D, to recirculate into the loop 140. The 5% of the light which is not coupled will leave the coupler 10 through port B. This light will be output from the fiber 12 through the fiber exit 144, as the second signal 162 of the series of signals at time $T_3$. After the first output signal 161 at time $T_2$, the successive output signals occur periodically. Thus, it may be seen that the second output signal 162 is an exact reproduction of the first signal 161 that was output, although at reduced amplitude, and both are identical to the input signal 160, but at a lower amplitude.

Each time the light circles the loop 140, 95% of the light will be recirculated back into the loop 140, and 5% of the light will be output from the device. Thus, for any input signal, a series of output signals identical to the input signal but with decreasing amplitude will be supplied from the device. The first output signal 161 is fairly large, and it is followed by a series of smaller output signals which decrease in amplitude exponentially. While the successive output signals may differ somewhat in pulse shape due to dispersion, they will be substantially identical, and they will be separated to provide adequate resolution of consecutive output signals as long as the duration of the input signal 160 supplied to the device is sufficiently shorter than the delay time provided by the loop 140 to compensate for dispersion. Thus, it can be seen that a signal may be modulated onto the light input to the device, and a series of decreasing amplitude output pulses will be periodically provided to the decoder/data processor 154, the length of the period proportional to the length of the fiber 12 in the loop 140.

This feature makes the system highly useful as a recirculating memory device supplying data to a processor, since the series of identical output signals allows the data processor to sample different portions of the data upon successive circulations. In this way, a data processor operating at a slower rate than the device generating the data may be used by utilizing the recirculating memory.

In FIG. 6, for example, during the first output signal 161, the first data bit may be read by the data processor. During the second series 162, the second bit may be read. During the third series 163, the third bit may be read, and so on.

The device shown in FIG. 5 may also be used as a tap delay line transversal filter to pass some frequencies and reject others. A basic optical tap delay line is shown in FIG. 7. A light source 170 injects light into an optical fiber 172. This optical fiber 172 has four taps 180, 182, 184, 186 installed along its length, with the taps 180, 182, 184, 186 being separated by equal lengths L of the optical fiber 172. The taps 180, 182, 184, 186 will each couple a portion of the light traveling in the fiber 172 to their outputs, which are, respectively, outputs 190, 192, 194, 196.

If the light source 170 provides an input signal which varies as some function of time, the optical tap may be used to filter selected frequencies from the input signal. Thus, by summing the outputs 190, 192, 194, 196, the device may be used to attenuate any input signal content other than a selected fundamental frequency or that fundamental frequency's harmonics. Thus, by making the length L of the fiber 172 between the taps 180, 182, 184, 186 that length which will provide a delay time equal to the period of this fundamental frequency, the device will filter an input light signal to attenuate all other frequencies, providing at the summed output a signal comprising the fundamental and harmonic frequency content of the input signal.

The recirculating loop device disclosed here may be used as a transversal filter by providing an input signal from the laser light source 150 and the modulator 152 which varies as some function of time. The period of the fundamental frequency may be set by selecting the length of the fiber 12 in the loop 140 so that its delay time will be equivalent to the period of the fundamental frequency desired. That portion of the input signal corresponding to the fundamental frequency and the harmonics of that frequency will then be passed from the fiber exit 144 to the decoder/data processor 154, but other frequencies will be attenuated, since they do not constructively add at the coupler 10, and thus the device may be used to indicate the presence or absence of the fundamental frequency and its harmonics.

The advantages of this device over the Suzaki device are fairly impressive. There are no longer any losses caused by the necessity of having a splice in the loop. Since the presence of a splice causes great losses, the limitation of the Suzaki device is that only a relatively small number of output pulses may be obtained. The device of the present invention, on the other hand, has no loss due to the presence of a splice, and therefore is able to provide a greater number of output pulses of a usable amplitude. This allows a greater difference between processing speed and input speed.

The second advantage the device of the present invention has over the Suzaki reference is that much higher frequencies may be used, since single mode optical fiber is used rather than the multi-mode fiber of the Suzaki device. This advantage, of course, is also a significant advantage over the coaxial cable and acoustic devices described above. The higher frequencies and lower losses of the device disclosed here enable a recirculating memory device to be used in a system which generates data at such a high rate that a conventional data processor cannot handle it. The accurate transmission of such data is now made possible by this device.

What is claimed is:

1. A fiber optic recirculating memory device, comprising:

an optical coupling device;

a first optical fiber extending through said optical coupling device, said first fiber having two ends, one end extending from a first side of said coupling device, the other end extending from a second side of said coupling device;

a second optical fiber extending through said optical coupling device, said second fiber having two ends, one end extending from said first side of said coupling device, the other end extending from said second side of said coupling device, said coupling device optically coupling light between said first and second optical fibers; and a third optical fiber optically aligned between an end of one of said first and second optical fibers extending from said first side of said coupling device and an end of the other of said first and second optical fibers extending from said second side of said coupling device.

2. A fiber optic recirculating memory device as defined in claim 1, wherein said optical coupling device comprises:

means positioning said first optical fiber and said second optical fiber within said optical coupling device with a portion of the cladding removed from said first and second optical fibers, with the portions of said first and second optical fibers where said cladding has been removed in close facing relationship to form a region of interaction in which guided modes of said first and second optical fibers interact through their evanescent fields to cause light to be transferred between the core portions of said first and second optical fibers.

3. A fiber optic recirculating memory device as defined in claim 1, wherein said first, second, and third optical fibers comprise:

a single, continuous, splice-free length of optical fiber.

4. A fiber optic recirculating memory device as defined in claim 1, wherein at least one of said first, second, and third optical fibers are comprised of single mode optical fiber.

5. A fiber optic recirculating memory device as defined in claim 1, wherein the efficiency of said optical coupling device is greater than 50%.

6. A fiber optic recirculating memory device as defined in claim 1, wherein said third optical fiber comprises:

a length of optical fiber to provide a delay time in the transmission of light within said length of optical fiber, said delay time being directly proportional to the length of said length of optical fiber.

7. A fiber optic recirculating memory device as defined in claim 6, wherein said delay time is at least as long as the period of a high frequency signal to be stored in said recirculating memory device.

8. A fiber optic delay line, comprising:

a single, continuous, splice-free strand of fiber optic material forming a loop to provide a time delay light path, the portions of said strand at the ends of said loop juxtaposed in side-by-side relationship to form an interaction region for transferring light between said portions to provide an optical path between the ends of said loop.

9. A fiber optic delay line, comprising:

an optical fiber, forming a loop portion, and having first and second end portions, said first end portion providing an input to said delay line for an input light signal, and said second end portion providing an output from said delay line; and said first and second end portions positioned in side-by-side relationship to cause:
  a. coupling of a portion of said input light signal from said first fiber end portion to said second fiber end portion;
  b. the uncoupled portion of said input light signal from said first end portion to enter said loop portion for propagation thereabout to provide a circulating light signal;
  c. coupling a fraction of said circulating light signal in said loop portion back into said loop portion after a circulation in said loop portion; and
  d. the uncoupled fraction of said circulating light signal in said loop portion to propagate to said output after a circulation in said loop portion.

10. A fiber optic delay line as defined in claim 9, wherein said coupling occurs through interactions of the evanescent fields of light in said fiber.

11. A fiber optic delay line comprising:

a loop of single mode optical fiber;

a light input;

a light output; and means for coupling, said means:
  a. coupling a first percentage greater than half of an input light signal to said output;
  b. permitting an uncoupled second percentage of said input light signal to enter said loop;
  c. coupling a fraction of said second percentage of light circulating in said loop back into said loop after each circulation in said loop; and
  d. permitting a fraction of said second percentage of light circulating in said loop to be provided to said output after each circulation in said loop.

12. A fiber optic delay line as defined in claim 11, wherein said fiber optic loop comprises:

a single, continuous, splice-free length of optical fiber.

13. A fiber optic recirculating memory device, comprising:

a single, continuous, uninterrupted, strand of optical fiber having an input end portion and an output end portion;

said single, continuous optical fiber forming a loop portion between said input and output end portions; and said single, continuous optical fiber having a pair of juxtaposed surfaces for coupling light between said loop portion and said end portions.

14. A fiber optic recirculating memory device, comprising:

an optical fiber delay line, said delay line having a first end and a second end; and means for optically coupling light from a portion of said delay line near said first end to a portion of said delay line near said second end, thereby forming a spliceless recirculating loop through which a light pulse may propagate, said light pulse being introduced into said loop from said first end of said delay line, portions of said light pulse being removed from said loop through said second end each time said light pulse passes through the portion of said delay line which is optically coupled by said coupling means.

15. In a fiber optic recirculating delay line comprising a loop of optical fiber, a method of filterihg a modulated light signal to pass a fundamental frequency and its harmonics, comprising:

selecting the delay time of said loop to equal an integer multiple of the period of modulation of said modulated light signal;

inputting said modulated light signal into said delay line;

introducing a portion of said input modulated light signal into an input end of said loop for circulation therein to provide a delayed modulated light signal at the output end of said loop;

summing said input modulated light signal with said delayed modulated light signal to provide a filtered modulated light signal; and outputting at least a portion of said filtered modulated light signal from said delay line.

16. A fiber optic recirculating memory device, comprising:

a single spliceless optical fiber;

means for optically coupling light from a first portion of said optical fiber to a second portion of said optical fiber;

means for delaying a light pulse traveling in said optical fiber between said first portion of said optical fiber and said second portion of said optical fiber; and means for periodically providing as an output a portion of said light pulse traveling in said optical fiber between said first and second portions of said optical fiber.

17. A fiber optic recirculating memory device as defined in claim 16, wherein said optical fiber comprises:

a length of single mode optical fiber.

18. A fiber optic recirculating memory device as defined in claim 17, wherein said optical coupling means utilizes interactions of the evanescent fields of said first and second portions of said optical fiber to couple light between said first and second portions of said optical fiber.

19. A fiber optic recirculating memory device, comprising:

a single, continuous, splice-free optical fiber having an input end for receiving optical signals and an output end for emitting optical signals transmitted by the optical fiber;

a loop formed in said single, continuous, splice-free optical fiber between said input end and said output end; and an optical coupling device connected between said input end and said output end of said single, continuous, splice-free optical fiber for coupling a first percentage of the optical signals received at said input end to said output end, and for introducing a second percentage of the optical signals received at said input end into said loop for recirculation within said loop and for coupling a percentage of the optical signal in said loop to said output end each time the optical signal recirculates through said loop.

20. A fiber optic recirculating memory device according to claim 19 wherein said optical fiber includes a central core and an outer cladding, and the optical coupling device includes means for holding portions of said input end and said output end from which a portion of said cladding has been removed in close facing relationship to form an interaction region in which evanescent field coupling between said portions transfers light between said input end and said output end of said optical fiber.

21. A fiber optic recirculating memory device, comprising:

a single-mode optical fiber having a central core and an outer cladding, said fiber including an input end for receiving optical signals and an output end for emitting optical signals transmitted by the optical fiber;

a loop formed in said optical fiber between said input end and said output end; and an optical coupling device connected between said input end and said output end of said optical fiber for coupling a first percentage of the optical signals received at said input end to said output end, and for introducing a second percentage of the optical signals received at said input end into said loop for recirculation within said loop and for coupling a percentage of the optical signal in said loop to said output end each time the optical signal recirculates through said loop, said optical coupling device including means for holding portions of said output end and said output end from which a portion of said cladding has been removed in close facing relationship to form an interaction region in which evanescent field coupling between said portions transfers light between said input end and said output end of said optical fiber.

22. A fiber optic recirculating memory device according to claim 21 wherein said optical coupling device has a coupling efficiency greater than 50%.

23. A fiber optic recirculating memory device according to claim 22 wherein said loop provides a predetermined delay time for transmission of optical signals therethrough.

24. A fiber optic recirculating memory device according to claim 23 wherein the delay time is at least as long as the period of a signal of predetermined frequency to be stored in the recirculating memory device.

25. A fiber optic recirculating memory device according to claim 24 wherein said optical coupling device supplies a sequence of light pulses of substantially identical shape to said output end with the number of light pulses of usable level being determined by the formula $$n = \frac{\ln \frac{P_t}{P_o} + \ln \frac{1}{(1-l)^2}}{\ln(K \cdot l)}$$

where n is the number of usable output pulses, $P_t/P_o$ is the ratio of minimum detectable output power to the power of optical signals supplied to said input end, 1 is the coefficient of coupling of said optical coupling device, and K is the percentage of power transmitted by said loop.

26. A method of producing a sequence of optical pulses from a single input pulse, each of the series of optical pulses being substantially identical in shape to the input pulse, comprising the steps of:

forming a loop in a single, continuous, splice-free optical fiber having an input end and an output end;

supplying an input light pulse to the input end;

coupling a percentage of the input light pulse into the loop for recirculation therethrough; and coupling a percentage of the light in the loop to the output end each time the pulse in the loop recirculates therethrough.

27. A fiber optic recirculating memory device, comprising:
an optical fiber waveguide comprising a first fiber segment having input and output portions;
said waveguide additionally comprising a second fiber segment, having input and output portions, said second fiber segment juxtaposed with said first fiber segment in side-by-side relationship to cause optical coupling from the input portion of one of said fiber segments to the output portion of the other of said fiber segments;
said waveguide further comprising a third fiber segment for guiding light between said output portion of said first fiber segment and said input portion of said second segment.

28. A fiber optic recirculating memory device, as defined in claim 27, wherein said waveguide comprises a splice-free strand of optical fiber.

* * * * *